United States Patent
Tångring et al.

(10) Patent No.: US 11,493,702 B2
(45) Date of Patent: Nov. 8, 2022

(54) OPTOELECTRONIC COMPONENT

(71) Applicant: OSRAM OLED GmbH, Regensburg (DE)

(72) Inventors: Ivar Tångring, Regensburg (DE); Rebecca Römer, Regensburg (DE); Claudia Jurenka, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 161 days.

(21) Appl. No.: 16/961,771

(22) PCT Filed: Dec. 19, 2018

(86) PCT No.: PCT/EP2018/085910
§ 371 (c)(1),
(2) Date: Jul. 13, 2020

(87) PCT Pub. No.: WO2019/141480
PCT Pub. Date: Jul. 25, 2019

(65) Prior Publication Data
US 2021/0063652 A1 Mar. 4, 2021

(30) Foreign Application Priority Data
Jan. 22, 2018 (DE) .................. 10 2018 101 326.4

(51) Int. Cl.
*H01L 33/50* (2010.01)
*H01L 33/54* (2010.01)
*G02B 6/42* (2006.01)

(52) U.S. Cl.
CPC .......... *G02B 6/4204* (2013.01); *H01L 33/504* (2013.01); *H01L 33/54* (2013.01)

(58) Field of Classification Search
CPC .............................. H01L 33/504; H01L 33/54
See application file for complete search history.

(56) References Cited

U.S. PATENT DOCUMENTS

2007/0096113 A1* 5/2007 Inoshita .................. H01L 33/56
257/E33.059
2009/0256166 A1* 10/2009 Koike ..................... H01L 33/56
257/E33.059
(Continued)

FOREIGN PATENT DOCUMENTS

DE   102012109083 A1   3/2014
DE   102014107972 A1   10/2015
(Continued)

OTHER PUBLICATIONS

International Search Report for International Patent Application No. PCT/EP2018/085910, dated Mar. 21, 2019.

*Primary Examiner* — Mark W Tornow
(74) *Attorney, Agent, or Firm* — ArentFox Schiff LLP (57) ABSTRACT

The invention relates to an optoelectronic component, which, in at least one embodiment, comprises an optoelectronic semiconductor chip having an emission side and a conversion element on the emission side. The conversion element is configured for conversion of a primary beam emitted by the semiconductor chip in operation as intended. The conversion element is divided into at least one first layer and one second layer. The first layer is arranged between the second layer and the emission side. The first layer comprises a first matrix material having fluorescent particles introduced therein. The second layer comprises a second matrix material having fluorescent particles introduced therein. The first matrix material of the first layer has a higher index of refraction than the second matrix material of the second layer.

17 Claims, 3 Drawing Sheets

(56) References Cited

U.S. PATENT DOCUMENTS

| | | | |
|---|---|---|---|
| 2011/0006668 A1* | 1/2011 | Hussell | H01L 33/501 |
| | | | 313/499 |
| 2012/0138981 A1* | 6/2012 | Chen | H01L 33/58 |
| | | | 257/E33.056 |
| 2015/0034067 A1 | 2/2015 | Szekely | |
| 2015/0054011 A1 | 2/2015 | Koizumi et al. | |

FOREIGN PATENT DOCUMENTS

| | | |
|---|---|---|
| EP | 1919000 A1 | 5/2008 |
| WO | WO2016023314 A1 | 2/2016 |

\* cited by examiner

OPTOELECTRONIC COMPONENT

This application is a 35 U.S.C.§ 371 National Phase of PCT Application No. PCT/EP2018/085910, filed Dec. 19, 2018, which claims priority to German Application No. 10 2018 101 326.4, filed Jan. 22, 2018, the disclosures of each of which are hereby incorporated by reference herein.

An optoelectronic component is specified.

An object addressed by the invention is to specify an optoelectronic component with an efficient radiation output coupling and a long service life.

Said object is achieved inter alia by means of the subject matter of the independent patent claim. Advantageous embodiments and extensions are the subject matter of the dependent claims.

According to at least one embodiment, the optoelectronic component comprises an optoelectronic semiconductor chip having an emission side. For example, in the intended operation of the semiconductor chip at least 50% or at least 80% of the electromagnetic radiation emitted from the semiconductor chip is decoupled via the emission side. The emission side essentially extends, for example, along a main extension plane of the semiconductor chip.

The optoelectronic semiconductor chip comprises a semiconductor layer sequence with an active layer for generating electromagnetic radiation. The semiconductor layer sequence is based on a III-V compound semiconductor material, for example. The semiconductor material can be, for example, a nitride compound semiconductor material, such as $Al_nIn_{1-n-m}Ga_mN$ or a phosphide compound semiconductor material such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, where in each case $0 \le n \le 1$, $0 \le m \le 1$ and $m+n \le 1$. In this case, the semiconductor layer sequence can comprise dopants and additional components. For the sake of simplicity, however, only the essential complements of the crystal lattice of the semiconductor layer sequence, thus Al, As, Ga, In, N or P are given, even if these may be partially supplemented and/or replaced by trace amounts of other substances. The semiconductor layer sequence is preferably based on AlInGaN.

In particular, the active layer of the semiconductor layer sequence contains at least one pn-junction and/or at least one quantum well structure, and when operated as intended, for example, can generate electromagnetic radiation in the blue or green or red spectral range, or in the UV range. The semiconductor chip preferably comprises one, in particular exactly one, contiguous active layer.

A semiconductor chip is understood here and in the following text to mean a separately handleable and electrically contactable element. A semiconductor chip is created in particular by separating it from a wafer compound. In particular, the side surfaces of such a semiconductor chip exhibit traces from the separation process of the wafer compound, for example. A semiconductor chip preferably comprises exactly one originally contiguous area of the semiconductor layer sequence grown in the wafer compound. The semiconductor layer sequence of the semiconductor chip is preferably designed to be contiguous. The optoelectronic semiconductor chip comprises a contiguous or a segmented active layer. For example, the lateral extension of the semiconductor chip, measured along a main extension plane of the active layer, is not more than 1% or not more than 5% or not more than 10% larger than the lateral extension of the active layer.

The semiconductor chip, for example, also contains the growth substrate on which the entire semiconductor layer sequence was grown. In this case, the semiconductor chip can be a volume emitter and/or a so-called flip chip. Alternatively, the semiconductor chip can be a thin-film chip and/or a surface emitter. In this case, the growth substrate is preferably removed.

According to at least one embodiment, the optoelectronic component comprises a conversion element on the emission side. For example, the conversion element is arranged directly on the emission side. Preferably, the conversion element either covers the emission side completely, or at least 80% thereof. In addition, the conversion element can also partially or completely cover side faces of the semiconductor chip that run transverse to the emission side.

For example, a thickness of the conversion element, measured perpendicular to the emission side or perpendicular to a main extension plane of the semiconductor chip, is at least 2 µm or at least 20 µm or at least 40 µm. Alternatively or in addition, the thickness of the conversion element can be no more than 200 µm or no more than 100 µm or no more than 80 µm, for example.

Here and in the following, the thickness of a layer is defined as the mean thickness averaged over the lateral extension of the emission side.

In accordance with at least one embodiment the conversion element is configured for converting a primary radiation emitted by the semiconductor chip during its intended operation. Primary radiation means the radiation which is generated by the active layer of the semiconductor chip and exits the semiconductor chip via the emission side. The conversion element is configured for full conversion or partial conversion. Preferably, the conversion element and the semiconductor chip are configured in such a way that the optoelectronic component emits light in the visible spectral range, preferably white light, during its intended operation.

According to at least one embodiment, the conversion element is divided into at least a first layer and a second layer. This means that the conversion element can be divided into exactly two layers or more than two layers. The first and second layers are stacked on top of each other in the direction away from the emission side. Preferably, the first and second layer are in direct contact with each other.

The first and/or second layer can be formed as a contiguous, preferably simply contiguous, structure. Preferably, the first and/or the second layer completely cover the emission side. This means that primary radiation emerging from the emission side preferably cannot exit the component without passing through the first and/or second layer of the conversion element. The first layer and/or the second layer are, in particular, integrally designed layers. This means that they are not themselves divided into further individual layers.

According to at least one embodiment, the first layer is arranged between the second layer and the emission side. For example, the first layer can be directly in contact with the emission side. In particular, the first layer is the layer of the conversion element closest to the semiconductor chip. For example, the distance from the first layer to the semiconductor material of the semiconductor chip is no more than 1 µm, or no more than 500 nm, or no more than 200 nm. The distance here is defined, in particular, as the mean distance.

According to at least one embodiment, the first layer comprises a first matrix material with phosphors incorporated therein.

According to at least one embodiment, the second layer comprises a second matrix material with phosphors incorporated therein.

The phosphors are embedded in the matrix materials and enclosed by them. Within the matrix materials, the phosphors are preferably statistically and/or homogeneously distributed.

The first and/or second matrix material is preferably a material that is radiation-permeable, in particular transparent, to the primary radiation and/or the converted radiation. The first and/or second matrix material is preferably an organic material, in particular a polymer. For example, the first and/or second matrix material in the corresponding first or second layer have a proportion by volume of at least 20% or at least 40% or at least 60% or at least 80%.

The phosphors are designed in particular for converting the primary radiation. For example, the phosphors are particles consisting of one or different inorganic phosphors. Particles are understood here to mean microscopically small solids that are not directly connected to each other by covalent or ionic or metallic bonds. For example, a particle has a maximum extension in each spatial direction of 50 μm, or 10 μm or 5 μm.

For example, the proportion by volume of phosphors in the first and/or second layer is at least 5% or at least 10% or at least 20% or at least 30%. For example, the proportion by mass of phosphors in the first and/or second layer is at least 30% or at least 40% or at least 50%. Alternatively or in addition, the maximum proportion by mass of the phosphors in the first and/or second layer can be 80% or 70% or 60%.

For example, the first and/or second layer have a thickness of at least 1 μm or at least 10 μm or at least 20 μm. Alternatively or in addition, the maximum thickness of the first and/or second layer can be 100 μm or 50 μm or 40 μm.

The first layer and the second layer are applied to the semiconductor chip, in particular, consecutively. This means that an interface is formed between the first and the second layer. The first and second layers, in particular the matrix materials of the first or second layer, are thus preferably not formed as a single piece or a single part or integrally with each other.

In accordance with at least one embodiment the first matrix material of the first layer has a higher refractive index than the second matrix material of the second layer. For example, the refractive index of the first matrix material is higher than the refractive index of the second matrix material by at least 0.01 or at least 0.02 or at least 0.03 or at least 0.04 or at least 0.05 or at least 0.06 or at least 0.07.

Alternatively or in addition, the refractive index of the first matrix material can be no more than 0.5 or no more than 0.2 higher than the refractive index of the second matrix material.

Here and in the following, the refractive index of a material is to be understood in particular to mean the refractive index at a wavelength of 589 nm. Furthermore, the refractive index of a material is understood in particular to mean the refractive index averaged over the volume occupied by the material.

In at least one embodiment, the optoelectronic component comprises an optoelectronic semiconductor chip with an emission side and a conversion element on the emission side. The conversion element is configured for converting a primary radiation emitted by the semiconductor chip during operation as intended. The conversion element is divided into at least a first layer and a second layer. The first layer is arranged between the second layer and the emission side. The first layer comprises a first matrix material with phosphors incorporated therein. The second layer comprises a second matrix material with phosphors incorporated therein.

The first matrix material of the first layer has a higher refractive index than the second matrix material of the second layer.

The problem addressed by the invention described here is, inter alia, that the matrix materials of conversion elements are subject to an aging process, which often progresses faster the higher the refractive index of the matrix material. The aging process is caused in particular by high temperatures.

On the other hand, a high refractive index of the matrix material is advantageous for efficient light extraction. Semiconductor materials typically used in a semiconductor chip have a refractive index in the range of 2.5 or more. The matrix materials applied on the emission side have a much lower refractive index, typically in the range between 1.4 and 1.6. Therefore, total internal reflection occurs at the interface between the semiconductor chip and the conversion element, in particular at the emission side, which reduces the extraction efficiency from the semiconductor chip. The lower the difference in refractive index of the semiconductor material from that of the matrix material, the lower the total internal reflection.

Thus, the lower the refractive index of the matrix material used in the conversion element, the higher the thermal stability often is, but the lower the extraction efficiency may be.

In the present invention, a split conversion element with a first layer and a second layer is used. In this design the first layer, arranged closer to the semiconductor chip, has a matrix material with a higher refractive index than the second layer arranged further away from the semiconductor chip. The high refractive index of the first layer increases the output efficiency. Since the first layer is close to the semiconductor chip, the heat generated in this layer due to conversion can be efficiently dissipated via the semiconductor chip. This reduces the risk of aging of the first layer despite the high refractive index of the first matrix material. On the other hand, heat cannot be removed as efficiently from the second layer with the second matrix material, which is arranged further away from the semiconductor chip. However, since a thermally stable material with a low refractive index can be selected for the second matrix material, this is less problematic.

According to at least one embodiment, the refractive index of the first matrix material is lower than the refractive index of the semiconductor material of the semiconductor chip. For example, a refractive index difference between the first matrix material and the semiconductor material of the semiconductor chip is at least 0.5 or at least 0.8. Alternatively or in addition, the refractive index difference can be no more than 1.2, or no more than 1.1 or no more than 1.0. The semiconductor material of the semiconductor chip, for example, has a refractive index between 2.0 and 3.0. The refractive index of the semiconductor material is understood to mean in particular the refractive index averaged over the entire semiconductor material of the semiconductor chip.

According to at least one embodiment, a radiation-permeable optical element is arranged on the conversion element, in particular on the side of the conversion element facing away from the semiconductor chip. The optical element can be translucent or transparent to the primary radiation and/or to the radiation converted by the conversion element.

The optical element can be, for example, a lens or a die having two main sides running essentially in parallel. The optical element can comprise or consist of a plastic or a siloxane, such as silicone, in particular clear silicone, or a glass. For example, the optical element is in direct contact with the conversion element. The optical element can completely cover the conversion element and/or the semiconductor chip.

According to at least one embodiment the refractive index of the optical element is no greater than the refractive index of the second matrix material. For example, a refractive index difference between the material of the optical element and the second matrix material is at least 0.01 or at least 0.02 or at least 0.05. Alternatively or in addition, the refractive index difference can be no more than 0.6, or no more than 0.5 or no more than 0.1.

For example, the material of the optical element has a mean refractive index between 1.45 and 1.52 inclusive.

According to at least one embodiment, the first and/or second matrix material is based on a silazane or siloxane, in particular a silicone. In particular, at least 90% by weight or at least 95% by weight of the first and/or second matrix material is formed by a silazane or siloxane. The silazane or siloxane can include phenyl groups and/or methyl groups.

According to at least one embodiment, the first layer comprises phosphors from a first phosphor. For example, the phosphors of the first phosphor make up at least 50% or at least 80% or at least 90% of the phosphors in the first layer. In addition to the phosphors of the first phosphor, the first layer may comprise other phosphors of one or more other phosphors.

According to at least one embodiment, a refractive index difference between the first phosphor and the first matrix material is a maximum of 1.0 or 0.9 or 0.8 or 0.7. A small refractive index difference between the first phosphor and the first matrix material ensures that the phosphors of the first phosphor have a weak scattering effect on radiation, in particular on the primary radiation.

According to at least one embodiment, the first layer and the second layer comprise phosphors of the same first phosphor. For example, the phosphors of the first phosphor, both in the first layer and in the second layer, make up at least 10% or at least 20% or at least 50% or at least 80% or at least 90% of the phosphors of the respective layer.

According to at least one embodiment, the first layer and the second layer each comprise a mixture of phosphors of different phosphors. The mixtures of phosphors in the first layer and the second layer are preferably the same, within the manufacturing tolerances.

According to at least one embodiment, the second layer comprises phosphors of a second phosphor. For example, the phosphors of the second phosphor in the second layer make up at least 50% or at least 80% or at least 90% of the phosphors in the second layer.

According to at least one embodiment, the first phosphor is different from the second phosphor. In the conversion of the primary radiation, the first and the second phosphor have different emission spectra, for example. For example, the two emission spectra then have a different main wavelength, where the main wavelength is the wavelength at which the emission spectrum has a global maximum. For example, the main wavelength of the second phosphor is shifted relative to the main wavelength of the first phosphor by at least 20 nm or at least 50 nm or at least 100 nm.

According to at least one embodiment, the first and the second phosphor are designed in such a way that during the conversion of the primary radiation emitted by the semiconductor chip in operation, the first phosphor causes a greater Stokes shift than the second phosphor. In particular, the emission spectrum of the first phosphor is red-shifted compared to the emission spectrum of the second fluorescent.

In this embodiment, the first fluorescent with the larger Stokes shift is thus closer to the semiconductor chip than the second fluorescent with the smaller Stokes shift. The phosphor with the larger Stokes shift generates more heat during the radiation conversion. Therefore, it is advantageous to arrange this phosphor closer to the semiconductor chip, where the heat dissipation is more efficient.

In accordance with at least one embodiment the first phosphor has a higher refractive index than the second phosphor. For example, the refractive index difference between the first phosphor and the second phosphor is at least 0.2 or at least 0.5. Alternatively or in addition, the refractive index difference can be no greater than 0.8 or no greater than 1.0. In this embodiment, the phosphor with the higher refractive index is therefore used in the matrix material with the higher refractive index. This can reduce the refractive index difference from the phosphor to the matrix material, which reduces the scattering effect of the phosphors.

According to at least one embodiment, a refractive index difference between the first phosphor and the first matrix material is lower, for example lower by at least 0.01 or at least 0.02 or at least 0.04 or at least 0.05 or at least 0.1, than a refractive index difference between the first phosphor and the second matrix material.

According to at least one embodiment, a refractive index difference between the second phosphor and the second matrix material is greater, for example greater by at least 0.01 or at least 0.02 or at least 0.04 or at least 0.05 or at least 0.1, than a refractive index difference between the second phosphor and the first matrix material.

According to at least one embodiment, the first phosphor is a nitride-based fluorescent. For example, the first phosphor comprises or consists of an earth-alkali silicon nitride or an earth-alkali aluminum silicon nitride. The earth-alkali metal is, for example, barium or calcium or strontium. For conversion, the first phosphor can be doped with a rare earth ion, such as $Eu^{2+}$, as an activator.

According to at least one embodiment, the second phosphor is a garnet-based fluorescent. The second phosphor, for example, has or consists of a rare-earth doped garnet, such as yttrium-aluminum garnet, abbreviated to YAG, or a luthetium-yttrium-aluminum garnet, abbreviated to LuYAG. For the conversion, the second phosphor can be doped with an activator, for example a rare earth element, such as cerium.

According to at least one embodiment, the first phosphor is designed to convert the primary radiation or blue light or UV light or yellow-green light into red to orange light. For example, a main wavelength of the radiation converted by the first phosphor is between 600 nm and 750 nm inclusive.

According to at least one embodiment, the second phosphor is designed to convert the primary radiation or blue light or UV-light into yellowish to greenish light. For example, a main wavelength of the radiation converted by the second phosphor is between 500 nm and 600 nm inclusive.

According to at least one embodiment, the first layer and/or the second layer have a thickness of at least half the wavelength or at least one or at least two times the wavelength of the primary radiation.

According to at least one embodiment, the first matrix material has a refractive index of at least 1.5 or at least 1.51 or at least 1.52 or at least 1.53 or at least 1.55. Alternatively or additionally, the maximum refractive index of the first matrix material may be 1.75 or 1.7 or 1.65 or 1.63 or 1.6.

According to at least one embodiment, the second matrix material has a maximum refractive index of 1.65 or 1.6 or 1.55 or 1.54 or 1.53 or 1.52 or 1.51. Alternatively or additionally, the refractive index of the second matrix material may be at least 1.45 or at least 1.46 or at least 1.47 or at least 1.48 or at least 1.49.

According to at least one embodiment, the first phosphor has a refractive index between 1.8 and 2.7 inclusive, preferably between 2.0 and 2.5 inclusive.

According to at least one embodiment, the second phosphor has a refractive index between 1.6 and 1.9 inclusive, preferably between 1.7 and 1.8 inclusive.

According to at least one embodiment, the semiconductor chip emits primary radiation in the blue spectral range and/or in the UV range in the intended operation. For example, a main wavelength at which the primary radiation has a global intensity maximum is between 380 nm and 490 nm.

According to at least one embodiment, in the intended operation the conversion element converts the primary radiation partially or completely into radiation in the green and/or red spectral range. A main wavelength of the converted radiation lies, for example, in the spectral range between 500 nm and 750 nm inclusive.

According to at least one embodiment, the conversion element comprises at least one additional layer on one side of the second layer facing away from the semiconductor chip. For example, the conversion element comprises exactly one additional layer or a plurality of additional layers. The additional layer is preferably in direct contact with the second layer. In the case of a plurality of additional layers, the other layers are also preferably in direct contact with each other. The one or more additional layers may also be designed to be contiguous, in particular simply contiguous, and/or to cover the entire emission side of the semiconductor chip. The thicknesses of the additional layers can be chosen to be the same as the thicknesses of the first layer or the second layer.

According to at least one embodiment, the additional layer comprises a matrix material with phosphors embedded therein. For example, the matrix material of the additional layer is based on a silazane or siloxane, in particular on silicone. The phosphors in the layers or the additional layers may be formed from one of the above-mentioned phosphors.

In accordance with at least one embodiment the matrix material of the additional layer has a lower refractive index than the second matrix material of the second layer. For example, the refractive index difference between the second matrix material and the matrix material of the additional layer is at least 0.01 or at least 0.02.

In the case of multiple additional layers, each of the multiple additional layers preferably comprises a matrix material with phosphors incorporated therein. The matrix materials are preferably chosen in such a way that the refractive index of the matrix materials decreases the further away the corresponding layer is from the semiconductor chip.

In the following an optoelectronic component described herein is explained in more detail with reference to the drawings and on the basis of exemplary embodiments. Identical reference signs indicate the same elements in the individual figures. The represented elements are not shown true to scale, however; rather, individual elements can be represented in exaggerated size for improved comprehension.

Figure 1:
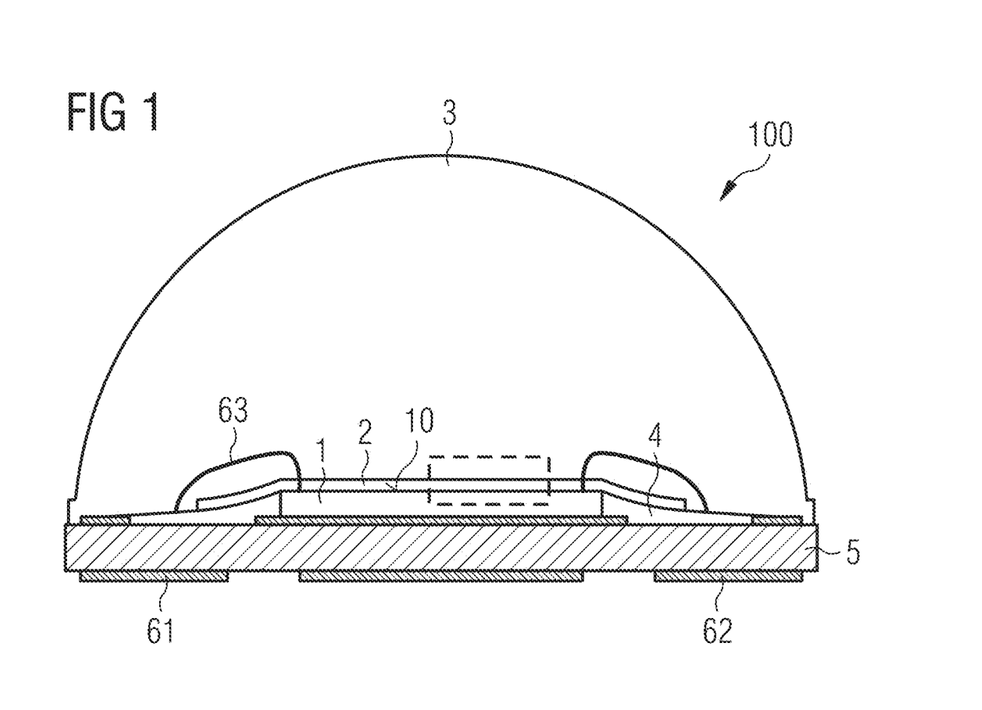
FIG. 1 shows an exemplary embodiment of an optoelectronic component in a cross-sectional view.

FIG. 1 shows an exemplary embodiment of an optoelectronic component 100 in a cross-sectional view. The optoelectronic component 100 comprises a semiconductor chip 1, for example an AlInGaN semiconductor chip, on a substrate 5. The semiconductor chip 1 is a thin-film chip, for example, in which the growth substrate has been removed. The substrate 5 is a ceramic substrate, for example.

The semiconductor chip 1 is connected in an electrically conductive manner to electrical contact elements 61, 62 by means of contact wires 63. The contact elements 61, 62 are exposed on a rear side of the substrate 5 on the opposite side to the semiconductor chip 1. In this case, the optoelectronic component 100 is therefore a surface-mountable optoelectronic component.

The semiconductor chip 1 emits primary radiation, in particular radiation in the blue spectral range or in the UV range, in the intended operation. The semiconductor chip 1 comprises an emission side 10, via which, for example, at least 50% of the radiation extracted from the semiconductor chip 1 is emitted during the intended operation. Lateral surfaces of the semiconductor chip 1 running at right angles to the emission side 10 are covered with a reflecting material 4. For example, the reflecting material 4 is a white silicone, for example a silicone doped with $TiO_2$ particles.

A conversion element 2 is applied to the emission surface 10 and to parts of the reflecting material 4. The conversion element 2 completely covers the emission side 10 of the semiconductor chip. Furthermore, the conversion element 2 is designed to be simply contiguous. The conversion element 2 is used for the partial or complete conversion of the primary radiation emitted by the semiconductor chip 1 in the intended operation. For example, in operation, the conversion element 2 converts the primary radiation partially or completely into light in the yellow to green and/or orange to red spectral range. The radiation emitted from the conversion element 2 is preferably white light.

The semiconductor chip 1 and the conversion element 2 are covered with an optical element 3. In this case, the optical element 3 is a lens, for example a silicone lens.

Figure 2:
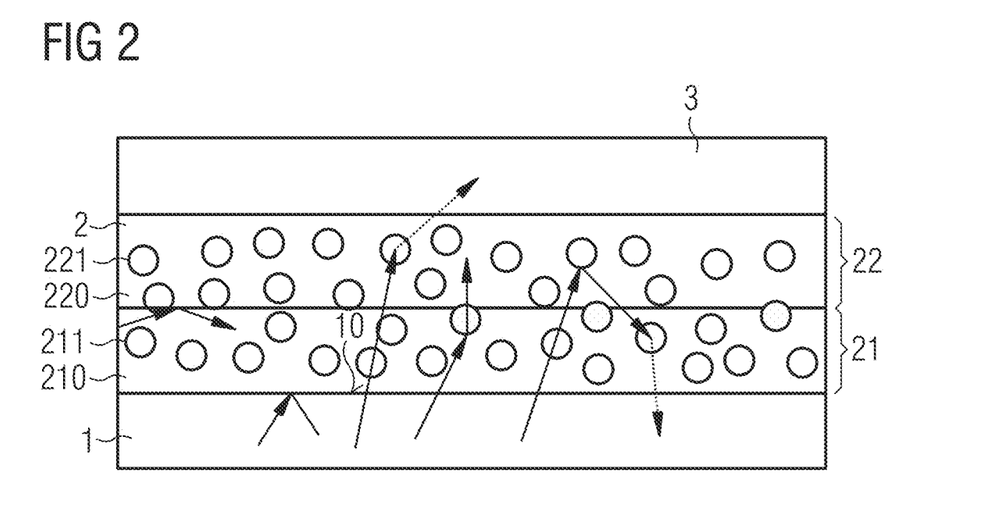
FIG. 2 shows a detail from the exemplary embodiment of FIG. 1, FIGS. 3A to 3E show different positions in an exemplary embodiment of a method for producing an optoelectronic component.

In FIG. 2, the excerpt outlined with a dashed box in FIG. 1 is shown enlarged. It is apparent that the conversion element 2 consists of two layers 21, 22. The first layer 21 comprises a first matrix material 210 with phosphors 211 embedded therein. The second layer 22 comprises a second matrix material 220 with phosphors 221 embedded therein. The first layer 21 and the second layer 22 are in direct contact with each other and are separated from each other by an interface.

The phosphors 211 of the first layer 21 are preferably a mixture of phosphors of different phosphors. The same preferably applies to the phosphors 221 of the second layer 22. The mixtures of phosphors used in the first layer 21 and the second layer 22 are, for example, equal within the scope of the manufacturing tolerance.

The first matrix material of 210 has a higher refractive index than the second matrix material 220. This reduces the total internal reflection at the emission surface 10 for primary radiation coming from the semiconductor chip 1, compared to the case in which the second matrix material 220 were to be used for the entire conversion element 2. On the other hand, the use of the second layer 22 with the second matrix material 220 with the lower refractive index is advantageous, because the light conversion produces heat, which is dissipated less well the farther away from the semiconductor chip 1 that the heat is generated. In other words, in the intended operation, the second layer 22 heats up to higher temperatures than the first layer 21. However, the second matrix material 220 with the lower refractive index is more temperature-stable than the first matrix material 210 with the higher refractive index.

FIGS. 3A to 3E show different positions in a method for producing an optoelectronic component, in particular the optoelectronic component 100 of FIG. 1.

Figure 3A:
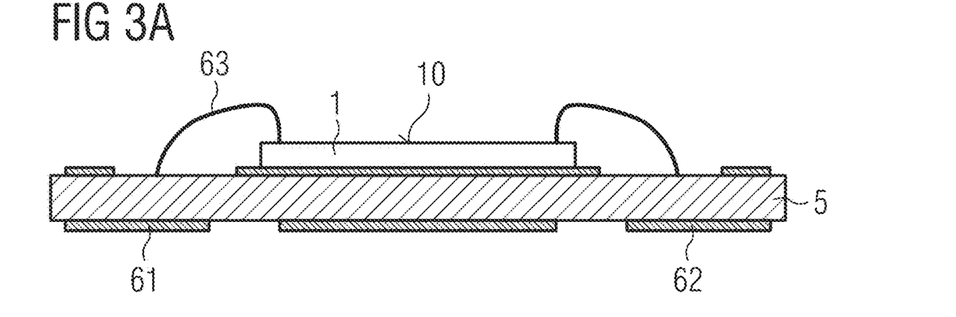

In the position of FIG. 3A, the substrate 5 is shown with the semiconductor chip 1 mounted thereon and electrically connected.

Figure 3B:
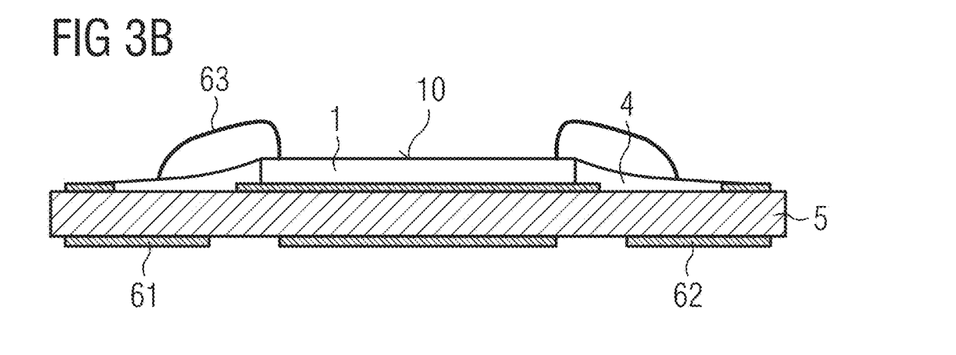

In the position of FIG. 3B, side faces of the semiconductor chip 1 are encapsulated with the reflecting material 4.

Figure 3C:
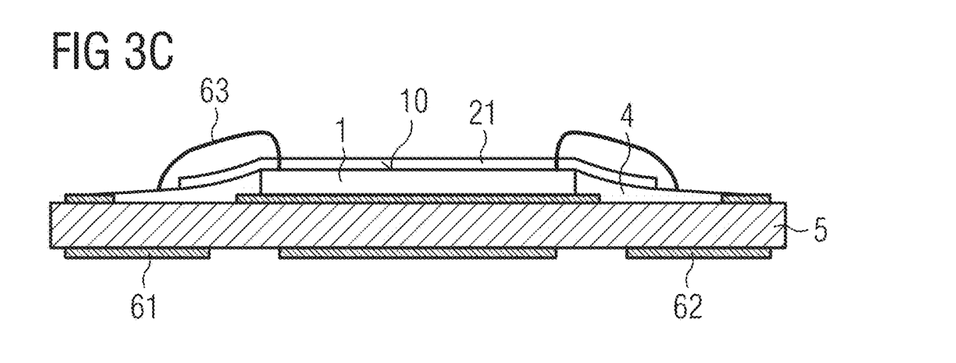

In the position of FIG. 3C, the first layer 21 of the conversion element 2 is applied to the semiconductor chip 1. For example, the first matrix material 210 with phosphors 211 distributed therein has been applied by spraying.

Figure 3D:
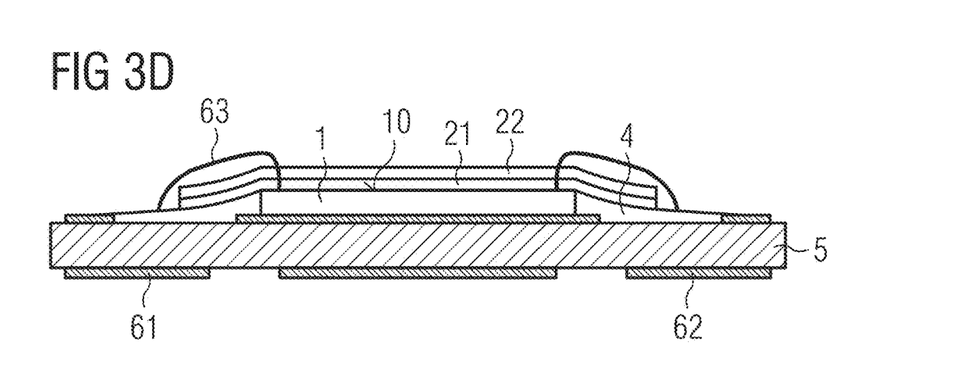

In the position of FIG. 3D, the second layer 22 of the conversion element 2 is applied. For example, the second matrix material 220 with incorporated phosphors 221 has again been sprayed on. The second layer 22 in this case has preferably been applied directly onto the first layer 21.

Figure 3E:
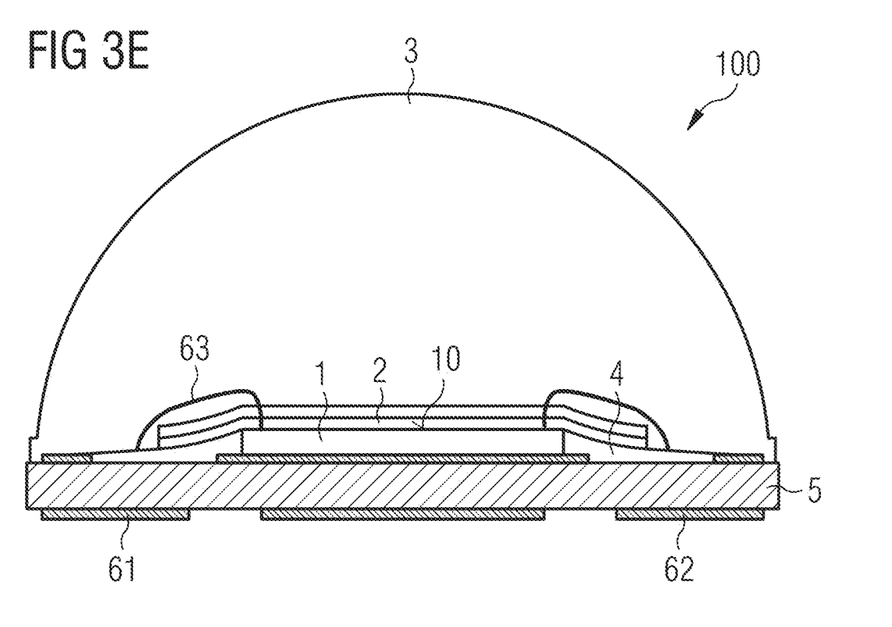

FIG. 3E shows a position in which the semiconductor chip 1, together with the conversion element 2, is encapsulated or overmolded with an optical element 3, in this case a silicone lens 3.

In the following, three more specific exemplary embodiments of the optoelectronic component 100 of FIG. 1 or the method according to FIGS. 3A to 3E are described.

In a first exemplary embodiment, a silicone with a refractive index of 1.56 is used as the first matrix material 210. For the second matrix material 220, a silicone with a refractive index of 1.51 is used. The phosphors 211, 221 are, for example, phosphors of the same phosphor, such as a garnet. The optical element 3 is formed from a silicone with a refractive index of 1.50.

In a second exemplary embodiment, the first matrix material is a silicone with a refractive index between 1.55 and 1.6 inclusive. Phosphors 211 of a first phosphor are distributed in the first matrix material 210. The first phosphor is a nitride-based fluorescent which converts the primary radiation of the semiconductor chip 1 into red light. The second matrix material 220 is a silicone with a refractive index between 1.50 and 1.54 inclusive. Phosphors 221 of a second phosphor are distributed in the second matrix material 220. The second phosphor is a garnet-based fluorescent, which converts the primary radiation into green light. The optical element 3 is again formed of a silicone with a refractive index of 1.50.

In a third exemplary embodiment, the first matrix material 210 is a silicone with a refractive index between 1.5 and 1.60 inclusive. Phosphors 211 of a first and a second phosphor are distributed in the first matrix material 210. The first phosphor is a nitride-based fluorescent which converts the primary radiation into red light. The second phosphor is a garnet-based fluorescent which converts the primary radiation into green light. The second matrix material 220 is a silicone with a refractive index between 1.41 and 1.52 inclusive. In the second matrix material 220, phosphors 221 of a second, garnet-based phosphor are distributed, which converts the primary radiation into green light. The material of the optical element 3 is silicone having a refractive index between 1.41 and 1.48 inclusive.

In order to test the performance of an optoelectronic component described here, the inventors have compared a component according to the invention with an alternative component. The component according to the invention comprised a conversion element with two layers, the first layer comprising a first matrix material with a refractive index of 1.55 and the second layer comprising a second matrix material with a refractive index of 1.51. This component according to the invention was compared with a first alternative component, in which the conversion element contained only one matrix material with a refractive index of 1.55, and with a second alternative component in which the conversion element contained only one matrix material with a refractive index of 1.51. The components were both operated at a current of 1500 mA at an ambient temperature of 125° C.

The result of this test was that comparable luminous intensities were achieved with the first alternative component and the component according to the invention, while the luminous intensity of the second alternative component was significantly lower. On the other hand, the conversion elements of the component according to the invention and the second alternative component showed hardly any signs of aging even after an operating period of over 600 h, whereas the first alternative component showed significant changes in the chromaticity coordinate.

The invention is not limited to the embodiments by the fact that the description is based on them. Rather, the invention comprises each new feature, as well as any combination of features, which includes in particular every combination of features in the patent claims, even if these features or this combination itself is not explicitly specified in the patent claims or exemplary embodiments.

LIST OF REFERENCE SIGNS 1 semiconductor chip
2 conversion element
3 optical element
4 reflective material
5 substrate
10 emission side
21 first layer
22 second layer
61 first contact element
62 second contact element
63 contact wire
100 optoelectronic component
210 first matrix material
211 phosphors
220 second matrix material
221 phosphors

The invention claimed is:
1. An optoelectronic component, comprising:
an optoelectronic semiconductor chip with an emission side;
a conversion element on the emission side, wherein
the conversion element is configured for converting a primary radiation emitted by the semiconductor chip in operation as intended,
the conversion element is divided into at least a first layer and a second layer,
the first layer is arranged between the second layer and the emission side, the first layer comprises a first matrix material with phosphor incorporated therein, the second layer comprises a second matrix material with phosphors incorporated therein, and the first matrix material of the first layer has a higher refractive index than the second matrix material of the second layer.

2. The optoelectronic component as claimed in claim 1, wherein the refractive index of the first matrix material is lower than a refractive index of the semiconductor material of the semiconductor chip.

3. The optoelectronic component as claimed in claim 1, wherein a radiation-permeable optical element is arranged on the conversion element, a refractive index of the optical element is not higher than the refractive index of the second matrix material.

4. The optoelectronic component as claimed in claim 1, wherein the first and/or the second matrix material is based on a silazane or siloxane or silicone.

5. The optoelectronic component as claimed in claim 1, wherein the first layer comprises phosphors of a first phosphor, a refractive index difference between the first fluorescent and the first matrix material is no greater than 1.0.

6. The optoelectronic component as claimed in claim 1, wherein the first layer and the second layer comprise phosphors particles from the same first phosphor.

7. The optoelectronic component as claimed in claim 1, wherein the first layer and the second layer each comprise a mixture of phosphors of different phosphors, the mixtures of phosphors in the first layer and the second layer being equal within the production tolerances.

8. The optoelectronic component as claimed in claim 1, wherein the first layer comprises phosphors of a first phosphor, the second layer comprises phosphors of a second phosphor, the second phosphor is different from the first phosphor.

9. The optoelectronic component as claimed in claim 8, wherein the first and the second phosphor are designed in such a way that during the conversion of the primary radiation emitted by the semiconductor chip in operation, the first phosphor causes a greater Stokes shift than the second phosphor.

10. The optoelectronic component as claimed in claim 8, wherein the first phosphor has a higher refractive index than the second phosphor.

11. The optoelectronic component as claimed in claim 8, wherein a refractive index difference between the first phosphor and the first matrix material is less than a refractive index difference between the first phosphor and the second matrix material.

12. The optoelectronic component as claimed in claim 8, wherein the first phosphor is a nitride-based fluorescent, the second phosphor is a garnet-based fluorescent.

13. The optoelectronic component as claimed in claim 1, wherein the first layer and/or the second layer have a thickness of at least half the wavelength of the primary radiation.

14. The optoelectronic component as claimed in claim 1, wherein the first matrix material has a refractive index of at least 1.5.

15. The optoelectronic component as claimed in claim 1, wherein the semiconductor chip generates primary radiation in the blue spectral range and/or in the UV range in the intended operation, in the intended operation the conversion element converts the primary radiation partially or completely into radiation in the green and/or red spectral range.

16. The optoelectronic component as claimed in claim 1, wherein the conversion element comprises at least one additional layer on one side of the second layer facing away from the semiconductor chip, the additional layer comprises a matrix material with phosphors embedded therein, the matrix material of the additional layer has a lower refractive index than the second matrix material of the second layer.

17. An optoelectronic component, comprising:

an optoelectronic semiconductor chip with an emission side;

a conversion element on the emission side, wherein the conversion element is configured for converting a primary radiation emitted by the semiconductor chip in operation as intended, the conversion element is divided into at least a first layer and a second layer, the first layer is arranged between the second layer and the emission side, the first layer comprises a first matrix material with phosphor particles incorporated therein, the second layer comprises a second matrix material with phosphor particles incorporated therein, the first matrix material of the first layer has a higher refractive index than the second matrix material of the second layer, the maximum thickness of the first and second layer is 100 μm or 50 μm, and the proportion by mass of phosphor particles in the first and second layer is at least 30%.

* * * * *